United States Patent
Omari et al.

(10) Patent No.: US 10,084,396 B2
(45) Date of Patent: Sep. 25, 2018

(54) SYSTEM AND METHOD FOR SIMPLIFYING INTERCONNECTION BETWEEN PANEL CONTROLS AND MOTOR POWER UNITS

(71) Applicant: Rockwell Automation Technologies, Inc., Mayfield, OH (US)

(72) Inventors: Ahmad K. Omari, Bayside, WI (US); Randall S. Langer, Oak Creek, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/188,362

(22) Filed: Jun. 21, 2016

(65) Prior Publication Data

US 2017/0366110 A1    Dec. 21, 2017

(51) Int. Cl.
*H02P 1/02* (2006.01)
*H01R 9/24* (2006.01)

(52) U.S. Cl.
CPC ............ *H02P 1/02* (2013.01); *H01R 9/2475* (2013.01)

(58) Field of Classification Search
CPC .................................................. H01L 23/5286
See application file for complete search history.

(56) References Cited

U.S. PATENT DOCUMENTS

| | | | |
|---|---|---|---|
| 5,416,399 A * | 5/1995 | Brunson | H02H 7/0816 318/479 |
| 5,775,935 A | 7/1998 | Barna | |
| 5,885,111 A | 3/1999 | Yu | |
| 5,941,734 A | 8/1999 | Ikeda et al. | |
| 6,087,792 A * | 7/2000 | Wang | A63B 22/02 318/362 |
| 6,161,278 A | 12/2000 | Easter et al. | |
| 6,923,675 B2 | 8/2005 | Gorin | |
| 7,410,386 B2 * | 8/2008 | Fabian | H01R 13/4367 439/441 |
| 8,615,878 B2 | 12/2013 | Chou | |
| 9,225,099 B2 | 12/2015 | Omari et al. | |
| 2001/0041476 A1 | 11/2001 | Sato et al. | |
| 2014/0265976 A1 * | 9/2014 | Weiss | G05D 23/1917 318/471 |

OTHER PUBLICATIONS

Schneider Electric. The Essential Gude, Instakits, IEC enclosed starters, Jun. 2010 (28 pages).
Rockwell Automation, Product Profde, IEC tank Connect Starter, Nov. 2006 (2 pages).
Extended European Search Report dated Aug. 10, 2015; European Patent Application No. 15169450.2—6 pages.

* cited by examiner

*Primary Examiner* — Muhammad S Islam
(74) *Attorney, Agent, or Firm* — Boyle Fredrickson, SC

(57) ABSTRACT

An interface circuit having releasable electrical connectors and as little as a single relay providing a standardized connection between panel controls intended for three-wire, two-wire or combination three-wire/two-wire control and a motor drive or motor controller. In this way, greatly simplified manufacturing of control cabinets may be provided with variations in control strategy being implemented simply by the provision of different panel controls having prewired harnesses and connectors.

16 Claims, 4 Drawing Sheets

SYSTEM AND METHOD FOR SIMPLIFYING INTERCONNECTION BETWEEN PANEL CONTROLS AND MOTOR POWER UNITS

CROSS REFERENCE TO RELATED APPLICATIONS

-

STATEMENT REGARDING FEDERALLY SPONSORED RESEARCH OR DEVELOPMENT

-

BACKGROUND OF THE INVENTION

The present invention relates generally to systems incorporating "motor power units" including motor soft starters and motor drives as are used to control industrial motors, and in particular to an interface circuit that simplifies the assembly of systems incorporating motor power units.

The sophisticated control of large electrical motors used in industry and manufacturing may be provided through the use of an electronic "motor drive" or "motor controller" (herein collectively termed "motor power units") having solid-state power processing circuitry controlled by microprocessor circuitry receiving control signals to start and stop the motor while providing overload and for motor drives, short circuit protection functions. An example advanced feature implemented by motor power units is a "soft start" where power is applied gradually to the motor after a start command is received to reduce surge currents and mechanical shock to attached equipment. Overload and short circuit protection functions, when provided, may not only disconnect the motor but also may provide current limiting and power management functions.

In practice, motor power units are normally incorporated into a metal control cabinet used to hold and interconnect the motor power unit and other circuit elements such as circuit breakers and disconnect switches. The control cabinet may have an enclosing front panel serving as mounting point for panel controls (such as switches and indicator lights) providing an interface with the motor power unit and associated circuitry.

The panel controls may include one or more electrical switches used to provide signals to the motor power unit to start and stop the motor being controlled. Such panel controls may be implemented in a number of different forms. In a "two-wire" system, a multiposition switch connects to the motor controller to "start" the motor in a first position and "stop" the motor in a second position. In a "three-wire" system, two independent momentary-contact pushbuttons may be used. A "start" pushbutton starts the motor when it is pressed. The motor remains running when the start pushbutton is released until a "stop" pushbutton is pressed.

Variations on the two-wire system includes a three-state "hand/off/auto" system which allows the incorporation of remote control to the motor (auto) as well as a manual run state (hand) and stop state (off). Another variation may combine two-wire and three-wire control.

Motor power units typically include separate "start" and "stop" input terminals to receive commands from the panel controls. The different control systems (two-wire, three-wire, etc.) may be implemented by using different panel controls and changing the wiring pattern between the panel controls and the motor power unit. Different control configurations can require many different wiring patterns increasing the complexity of manufacture and the possibility of error in the assembly of control cabinets.

SUMMARY OF THE INVENTION

The present invention is an electrical circuit that provides a standardized interface circuit between the panel controls and the motor power unit. The standardized interface circuit allows a wide variety of different control configurations to be implemented simply by attaching prewired panel controls for each of the various control strategies to a single common interface connector of the standard interface. In this way the standardized interface circuit permits pre-assembly of the control cabinet, motor power unit, and motor power unit harness for a wide variety of configurations while allowing variation in configuration to be provided simply by selection of prewired panel controls that may simply connect to the standardized interface circuit, for example, with pre-marked electrical connectors.

Specifically, in one embodiment, the invention provides an interface system connecting panel controls to a motor power unit, the interface system having a relay and a connector providing a first, second, third, and fourth interconnection point. The first interconnection point provides power; the second interconnection point connects to a relay coil of a relay; the third interconnection point communicates with the second interconnection point through a first normally-open relay contact of the relay; and the fourth interconnection point communicates with the second interconnection point through a two-terminal socket adapted to receive remotely controlled contact. A second normally-open relay contact of the relay communicates with a start input of the motor power unit so that prewired panel control switches for each of two-wire and three-wire controls of the motor power unit may alternately be connected through the releasable connector to the motor power unit without alteration of the interface circuit to provide two-wire and three-wire control of the motor power unit.

It is thus a feature of at least one embodiment of the invention to eliminate the complexity of custom wiring of a motor power unit two controls through the use of an interface that allows the selection of the controls to also select the desired control strategy.

The interface system may further include a panel control electrical switch prewired to a harness terminating in a first plug and wherein the connector of the interface system is a corresponding second plug adapted to receive a first plug.

It is thus a feature of at least one embodiment of the invention to allow the selection of the control strategy to be implemented with a simple attachment of electrical connectors without complexity or possible error that can occur from point-to-point wiring.

The panel control electrical switch maybe prewired to provide two-wire control of the motor power unit.

It is thus a feature of at least one embodiment of the invention to provide an option of common two-wire control.

For two-wire control, the panel control electrical switch may be a three-way switch having a pole connected to the first interconnection point, one throw connected to the second interconnection point, one throw connected to the fourth interconnection point and a remaining throw unconnected.

It is thus a feature of at least one embodiment of the invention to provide a standard connection that can accommodate a three-way switch (for hand/off/auto two-wire control) with one uncommitted interconnection point.

Alternatively, the panel control electrical switch maybe prewired to provide three-wire control of the motor power unit.

It is thus a feature of at least one embodiment of the invention to alternately permit common three-wire control using the standard interface.

For three-wire control, the panel control electrical switches may provide a series-connected normally-closed and normally-open pushbutton communicating between the first interconnection point and the second interconnection point with the connection between the pushbuttons communicating with the third interconnection point.

It is thus a feature of at least one embodiment of the invention to permit three-wire control in a standard connector by changing a single uncommitted interconnection point.

The panel control may further provides a three-way switch having a pole and one throw connected in series between the first interconnection point and the series-connected normally-closed and normally-open pushbuttons, a second throw connected to the fourth interconnection point, and the third throw unconnected.

It is thus a feature of at least one embodiment of the invention to permit combined two-wire and three-wire control by using each of the interconnection points of the standard interface.

The second plug may include an indicium matching with the indicium associated with the corresponding first plug. For example, the indicium corresponding to the first plug may be a colored sleeve surrounding the harness and the indicium of the second plug is a corresponding color.

It is thus a feature of at least one embodiment of the invention to permit configuration of the control system for two-wire or three-wire control simply by selecting panel controls and assembling them according to pre-established color codes.

The interface system may further include a socket for receiving a lamp connected to contacts of the motor power unit.

It is thus a feature of at least one embodiment of the invention to extend the concept of the present invention to the arbitrary provision of indicator lights and the like.

The second normally-open relay contact may communicate directly with the start input of the motor power unit or may control a second relay coil having a normally-open relay contact communicating power to the start input of the motor power unit.

It is thus a feature of at least one embodiment of the invention to permit the interface to be used with motor power units that are susceptible to race conditions between the start and stop buttons as well as those that are unsensitive to race conditions.

The interface system may further include a third normally-open contact of the relay communicating between the fourth interconnection point and the second interconnection point.

It is thus a feature of at least one embodiment of the invention to provide an additional relay contact for the handling of logic when a race condition may be exhibited by the motor power unit.

These particular objects and advantages may apply to only some embodiments falling within the claims and thus do not define the scope of the invention.

DETAILED DESCRIPTION OF THE PREFERRED EMBODIMENT

Figure 1:
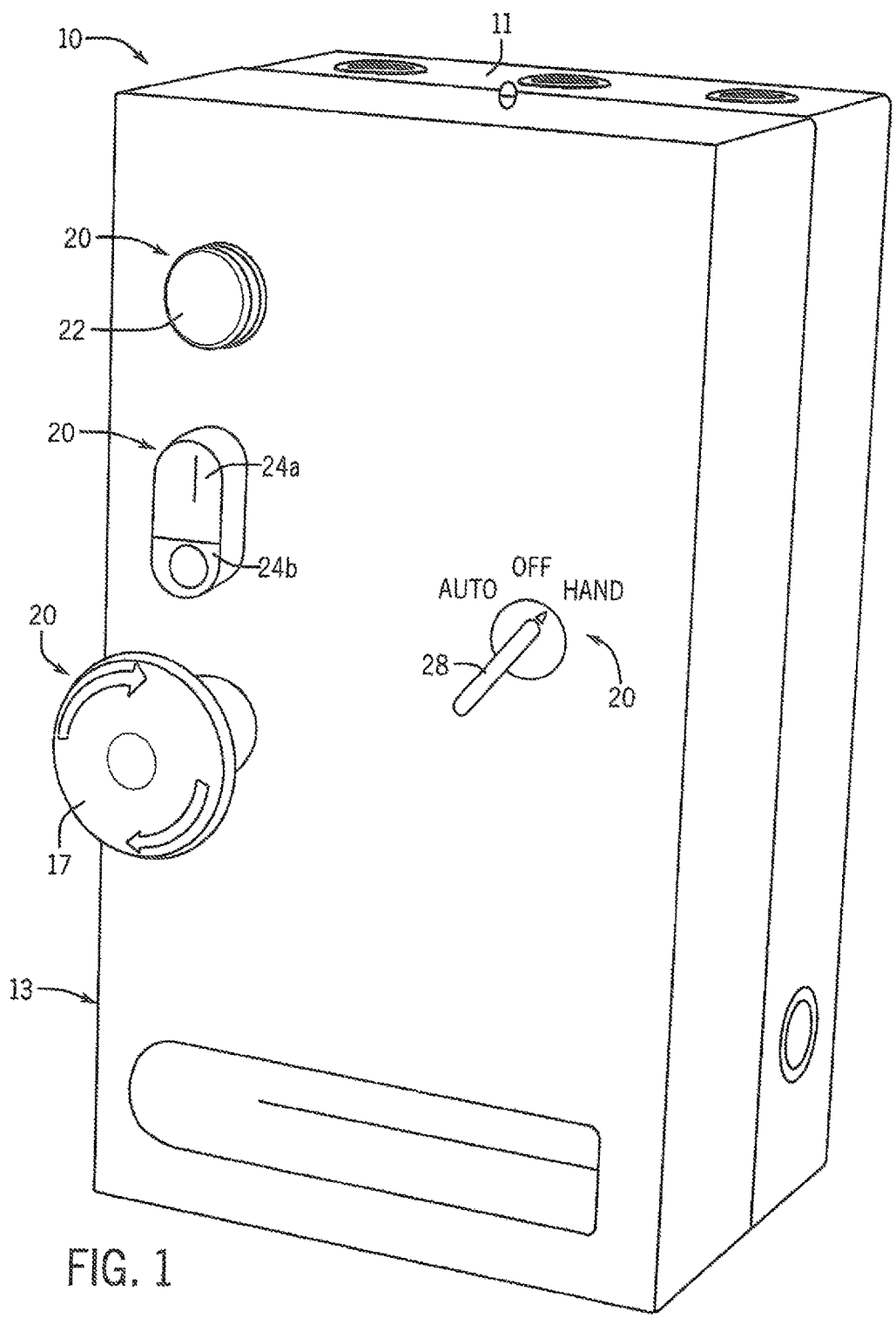
FIG. 1 is a front view of a control cabinet suitable for use with the present invention.

Turning initially to FIG. 1, an industrial enclosure 10 has a metal or plastic housing 11 having removable cover 13 openable to provide access to the inside of the housing 11 and to devices mounted within the housing 11. Optionally, the housing 11 may include, for example, a hinged door or removable panel to provide access to the inside of the housing 11. Still other configurations of the housing may be utilized without deviating from the scope of the invention.

The housing 11 includes a number of externally accessible panel controls 20 mounted to the front surface cover 13. According to the illustrated embodiment, the externally accessible panel controls 20 include an indicator lamp 22, a start/stop switch having a momentary contact pushbutton 24a, which is pressed to start a device, and a second momentary contact pushbutton 24b, which is pressed to stop the device, and an emergency stop pushbutton 17. Alternatively or in addition, the panel controls 20 may include a three positioned hand/off/auto switch as will be discussed below. The externally accessible panel controls 20 provide an interface to an operator. Devices such as switches, pushbuttons, dials, and the like may be mounted to the housing 11 to receive input from the operator, and devices such as lamps, displays, speakers, and the like may be mounted to the housing 11 to provide audio or visual indications to the operator. It is contemplated that numerous combinations and configurations of devices may be provided on various surfaces of the housing 11 according to an application's requirements without deviating from the scope of the invention.

Figure 2:
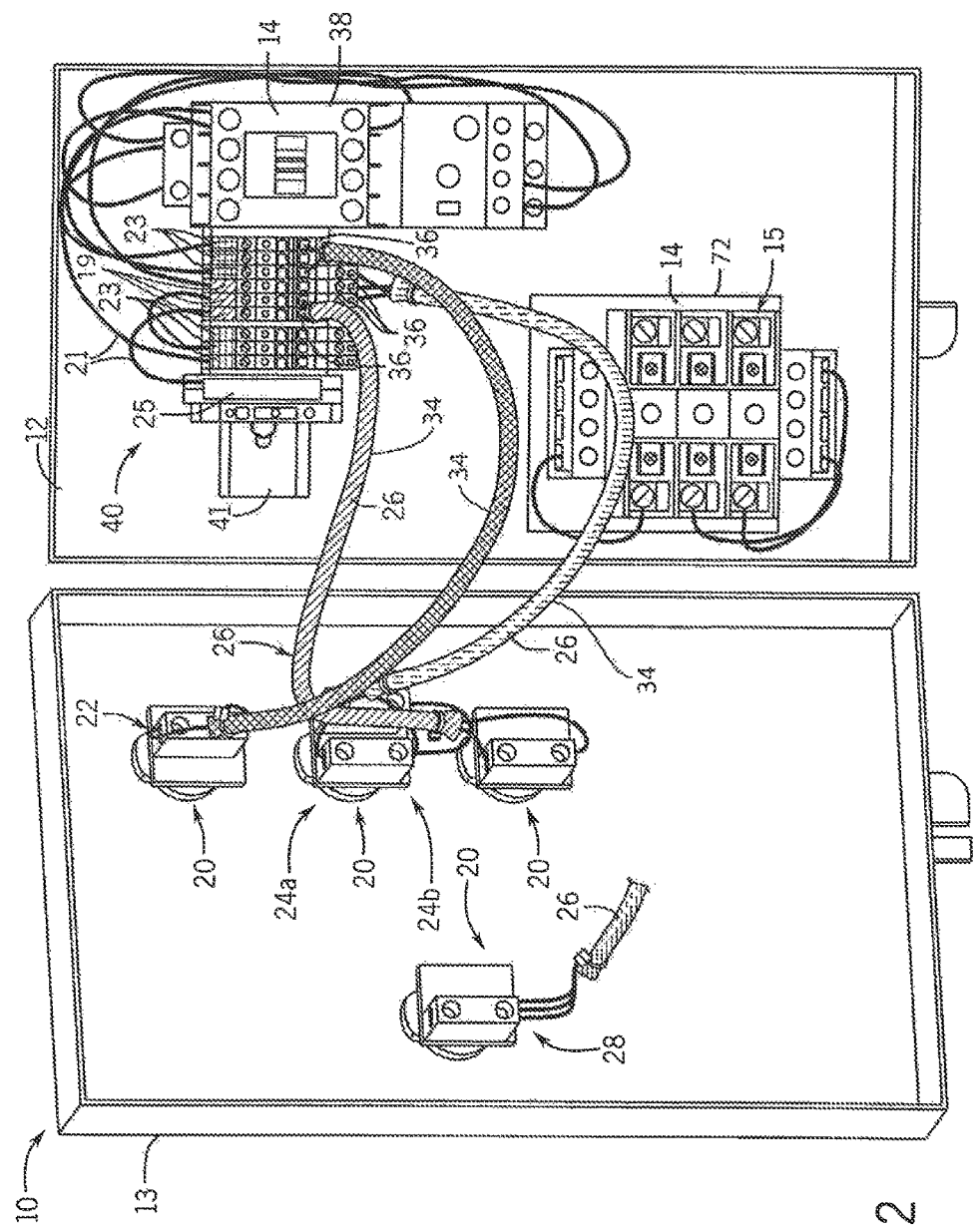
FIG. 2 is a view similar to FIG. 1 showing the control cabinet open showing a motor power unit and the interface of the present invention, and showing example prewired panel controls.

Turning next to FIG. 2, the industrial enclosure 10 is illustrated with the cover 13 removed from to reveal the back panel 12. The back side of each of the externally accessible panel controls 20 is visible and extends through the front surface of the cover 13 such that electrical connections to each of the externally accessible panel controls 20 are made within the industrial enclosure 10. The interior of the industrial enclosure 10 also has multiple internally mounted electronic devices 14 contained therein. According to the illustrated embodiment, one of the internally mounted electronic devices 14 is a transformer 72. The transformer 72 is configured to receive a voltage at a first level at input terminals and provide a voltage at a second level at the output terminals. For example, a 230 or 460 VAC voltage may be supplied to the industrial enclosure 10 and connected to the input terminals of the transformer 72, and a 110 VAC voltage may be provided at the output terminals of the transformer to operate the a motor power unit 38 such as a motor drive or motor soft starters and/or the indicator lamp 22. Example motor power units 38 suitable for use with the present invention include motor controllers available from Rockwell Automation under the trade designator SMC™ and motor drives under the trade designator of PowerFlex®. Other components may also be incorporated into the control cabinet 10 including for example overload relays, disconnect switches, circuit breakers and the like.

An integral protective block 15, including fuses, is mounted to the illustrated transformer 72. Optionally, the protective block 15 may be provided and mounted separately from the transformer 72 and/or include a circuit breaker or a combination of fuses and circuit breakers. Another of the internally mounted electronic devices 14 is a motor power unit 38 which may be energized or de-energized by the connecting the 110 VAC voltage from the output of the transformer 72 to the appropriate terminals of the motor power unit 38. The indicator light 22 may illuminate when power is present at the secondary of the transformer 72 as will be discussed below.

According to the illustrated control cabinet 10, when the start button 24a is pressed a signal is provided to the motor power unit 38 causing a control motor to operate. In two-wire control, power is maintained, keeping the controlled device operational, until either the stop button 24b or the emergency stop button 17 is pressed. The stop button 24b may initiate, for example, a controlled shut down of the controlled device, and the emergency stop button 17 may immediately remove power from the controlled device and further set a brake, insert a pin, or, by any other suitable method, cause, the controlled device to come to an immediate stop.

Electrical conductors of various harnesses 26 are provided within the control cabinet 10 to connect the panel controls 20 and interface circuit 40 mounted on the back panel 12. According to the illustrated embodiment, each of the externally accessible panel controls 20 has a first end of a harness 26 prewired to the panel control 20 of sufficient length to span between the cover 13 in the open position and the interface circuit 40. A second end of each of the harnesses 26 is connected to the interface circuit 40.

Each of the harnesses 26 for one of the externally accessible panel controls 20 is bundled into a single group. According to the illustrated embodiment, a color-coded sleeve 34, for example, a braided sheath, is provided that slides over each of the conductors of the harnesses for one of the panel controls 20 as held by a cable tie. The color-coded sleeve 34 extends along a majority of the length of the harness 26 leaving enough length the remaining ends of the harnesses 26 extending through the color-coded sleeve 34 to be connected to a plug connector 36. Optionally, the color-coded sleeve may be a wire loom, wire wrap, or other suitable outer jacket or material to hold the conductors of the harness 26 together in a group.

The interface circuit 40 may be assembled on a DIN rail 41 holding a set of DIN rail mounted terminal blocks 19 and at least one DIN mounted relay 25 that may be interconnected by point-to-point wiring 21 and/or terminal block jumpers performed in a factory environment to implement interface circuit 40 as will now be described. Terminal blocks suitable for this purpose are available from Rockwell Automation under the Trade Designator 1492 "Spring Clamp Connection Terminal Blocks" and related family devices.

The terminal blocks 19 may provide for sockets to receive the plugs 36 so that the panel controls 20 may be attached to the interface circuit 40 with a simple plug connection after matching colors on the color-coded sleeves with corresponding colored indicia 23 placed on the terminal blocks. A system of simplifying the matching of connectors 43 and 36 using color-coded harnesses 32 is described in U.S. Pat. No. 9,225,099 assigned to the assignee of the present invention and hereby incorporated by reference in its entirety.

Figure 3:
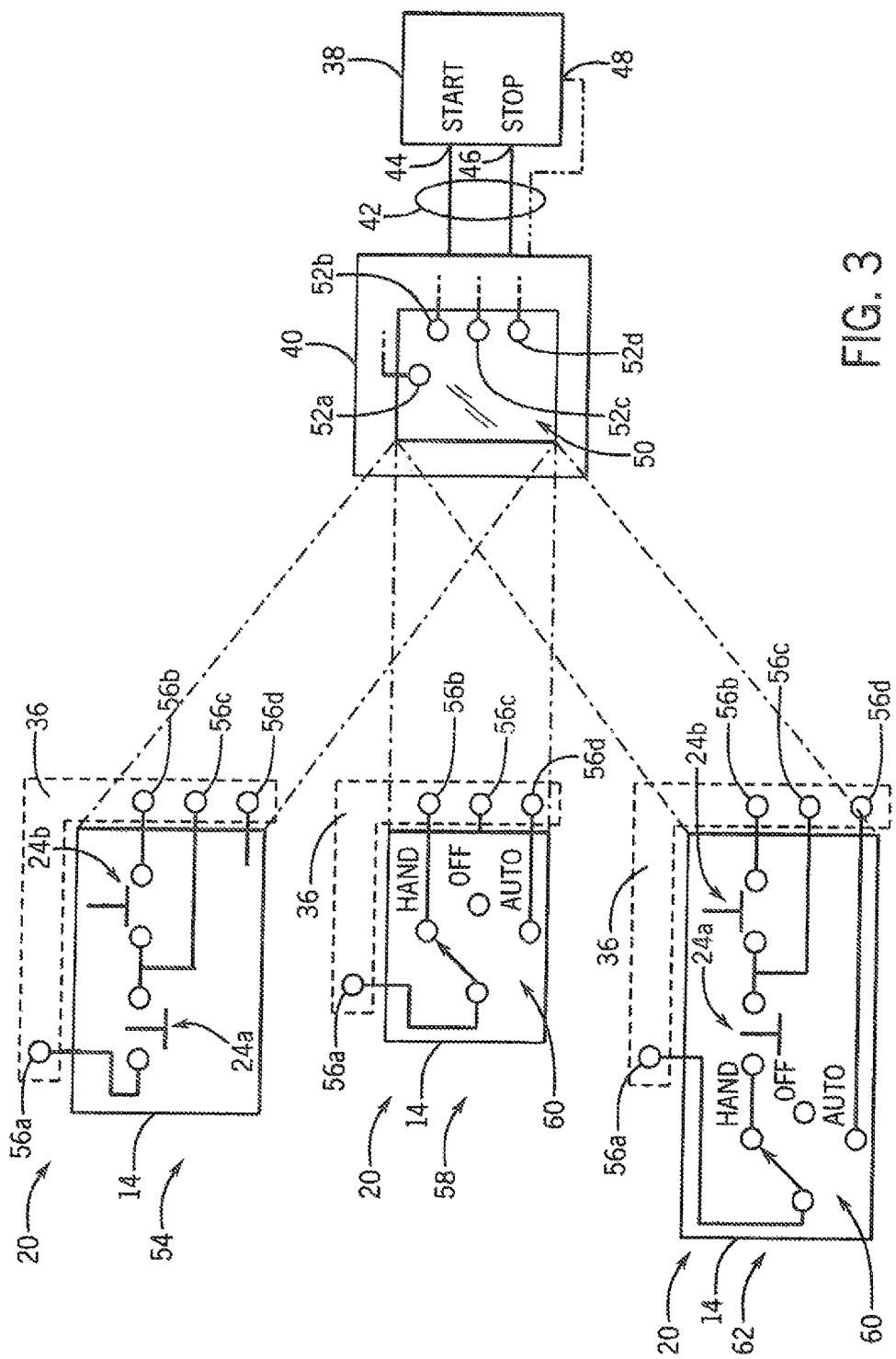
FIG. 3 is a block diagram of the interface of FIG. 1 together with three prewired panel control configurations for implementing two- and three-wire and combination two- and three-wire control strategies by attachment of the panel control configurations to a standardized connector assembly.

Referring also to FIG. 3, the interface circuit 40 may communicate with the motor power unit 38 by means of a harness 42 providing connections to a start input terminal 44 and a stop input terminal 46, as well as various other optional contacts and inputs 48 as will be discussed. This harness 42 may be standardized for the particular motor power unit 33 and interface circuit 40 to operate without modification for a wide variety of different control strategies as will be discussed below.

The start input terminal 44 and stop input terminal 46 will generally observe the following logic:

TABLE I

| Start button | Stop button | Action |
|---|---|---|
| 0 | 0 | Stop |
| 0 | 1 | Stop |
| 1 | 0 | Run |
| 1 | 1 | Stop |

Where the stop input terminal 46 has a negative logic where a low voltage is an assertion (1) and a high voltage is a release (0).

The interface circuit 40 provides a standardized connector assembly 50 providing interconnection points 52a-52d which may receive panel controls 20 pre-configured for a variety of different control strategies. The standardized connector assembly 50 may be implemented, for example, by one or more electrical connectors attachable to the connectors 36 discussed above.

In one example the panel controls 20 may be prewired to provide a three-wire panel control configuration 54. For example, the three-wire panel control configuration 54 may provide a first through fourth interconnection terminal 56a-56d attaching respectively to the first through fourth interconnection points 52a-56d. The panel controls 20 may include a first, normally-closed, momentary-contact pushbutton 24a and a second normally-open momentary-contact pushbutton 24b connected in series between terminals 56a and 56b. The junction between the momentary-contact pushbuttons 24a and 24b may connect to terminal 56c and terminal 56d maybe left unconnected.

As noted above, each of the control configurations will generally include one or more panel controls 20 prewired to a connector 36 with a harness 32 sharing a common color-coded sleeve 34. The panel controls 20 are independently mountable on the cover 13 which provides an integrating structure.

In an alternative two-wire panel control configuration 58 (adopting the same terminal numbering convention as above) a single pole three-way switch 60 may have its throw connected to terminal 56a and a first pole connected to terminal 56b (the "hand" position). A middle throw may be unconnected (the "off" position) and the remaining throw may be connected to terminal 56d (the "auto" position).

In yet a further alternative, a combination two-wire/three-wire panel control configuration 62 (also adopting the same terminal numbering convention as above) may combine the elements of the three-wire panel control configuration 54 and two-wire panel control configuration 58 by connecting three-position switch 60 such that its throw is connected to terminal 56a and a first throw connects to the series connection of momentary-contact pushbuttons 24a and 24b in turn leading to terminal 56b. As before the junction between momentary-contact pushbuttons 24a and 24b that connect with terminal 56c and the remaining or third pole of switch 60 connects with terminal 56d.

Figure 4:
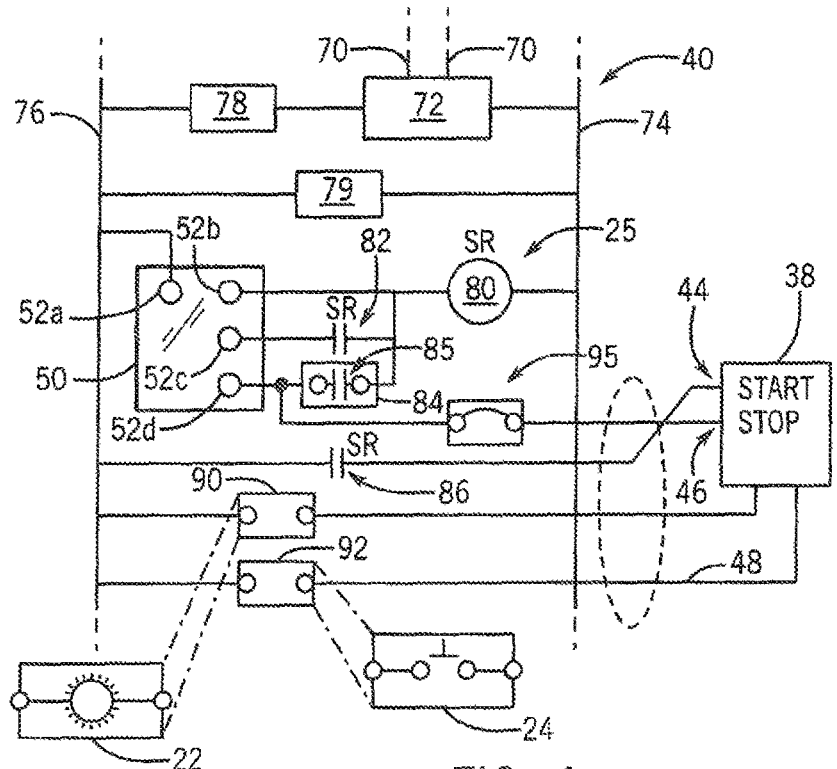
FIG. 4 is a fragmentary detailed schematic of the interface of FIG. 1.

Referring now to FIG. 4, the interface circuit 40 may receive line power 70, for example, through a port 16 shown in FIG. 1. This line power 70 connects to the primary of a transformer 72 which in turn provides power to power rails 74 and 76, the latter through an emergency stop disconnect switch 78. A power on indicator lamp 79 may be connected across these power rails 76 and 74 provided by a panel control (e.g., similar to lamp 22) providing an indicator light when power is applied to the control cabinet 10. The same transformer 72 may also provide power to the motor power unit 38 or an alternative power source may be used.

Power rail 76 is provided to interconnection point 52a of the standardized connector assembly 50. Interconnection point 52b connects to a relay coil 80 (designated SR) whose remaining terminal connects to power rail 74. Interconnection point 52c may connect to interconnection points 52b through a contact 82, the latter being a normally-open contact of relay SR. Interconnection points 52d may connect through a two-pin socket 84 with interconnection points 52b. This two-pin socket 84 may receive contacts 85 controlled by a remote control signal. Interconnection points 52d may also connect through jumper 95 with the stop input terminal 46 of the motor power unit 38. A second normally-open contact 86 of relay SR may connect from power rail 76 to the start input terminal 44 of the motor power unit 38.

Various sockets 90 may be provide, for example, to receive lamps 22 having one socket pin connected to power rail 76 and the remaining pin connected to a contact of the motor power unit 38 so that signals may be relayed from the motor power unit 38 to the panel controls. Similarly one or more sockets 92 may be provided, for example, receiving panel controls 20 and having one pin connected the power rail 76 and the remaining pin connected to an input of the motor power unit 38 so that commands may be sent to the motor power unit 38 in optional configurations.

Referring now to FIGS. 3 and 4, it will be appreciated that when the three-wire panel control configuration 54 is connected via the standardized connector assembly 50, a pressing of the start momentary-contact pushbutton 24b will cause power to be applied to the relay SR in turn closing contact 82. Closing of contact 82 insures that when momentary-contact pushbutton 24b is released, power is continued to be applied to relay SR thus providing a latching operation. Relay SR also controls contact 86 which provides power to the start input terminal 44 of the motor controller allowing the attached motor to be started.

Power applied to the stop input terminal 46 is obtained via jumper 95 enabling the controller to receive commands from a communication module (not shown) via a communication network or human interface module. Otherwise, and more generally, a signal is not required, in this configuration, to the stop input 46 of the motor power unit 38 which may start and stop based solely on the presence or absence of a signal at the start input 44. It will be appreciated that the remote control contact 85 in socket 84 may be used to lock out a starting of the motor but when closed allows starting of the motor.

After the motor has started, if momentary-contact pushbutton 24a (acting as a stop button) is pressed, power is removed from the relay SR unlatching the contacts 82 and 86 causing the motor to stop in response to the motor power unit 38 receiving no signal at the start input terminal 44.

Referring still to FIGS. 3 and 4, consider instead the connection of the two-wire panel control configuration 58 as installed into the standardized connector assembly 50 using the same connection points. In this case when the switch 60 is in the "hand" position as connecting to terminal 56b, power will flow to relay SR closing contact 86 to apply power to the start input terminal 44 of the motor power unit 38. This action will cause the motor to start.

In this control configuration, there is no latching and when the switch 60 is moved to the "off" position, power is removed from the start input terminal 44 and the motor stops. When the switch 60 is moved to the "auto" position, power is applied to the relay SR and thus contact 86 is closed only if remote contact 85 in socket 84 is closed allowing automatic control of the motor. When the switch 60 is moved to the "auto" position and jumper 95 is present, power is applied to the stop input terminal 46 enabling the controller to receive commands from a communication module via communication network or human interface module By similar operation, the control configurations 54 and 58 may be combined into control configuration 62 to provide combined functionality. The operation of this control configuration 62 will be evident from the description provided above.

Figure 5:
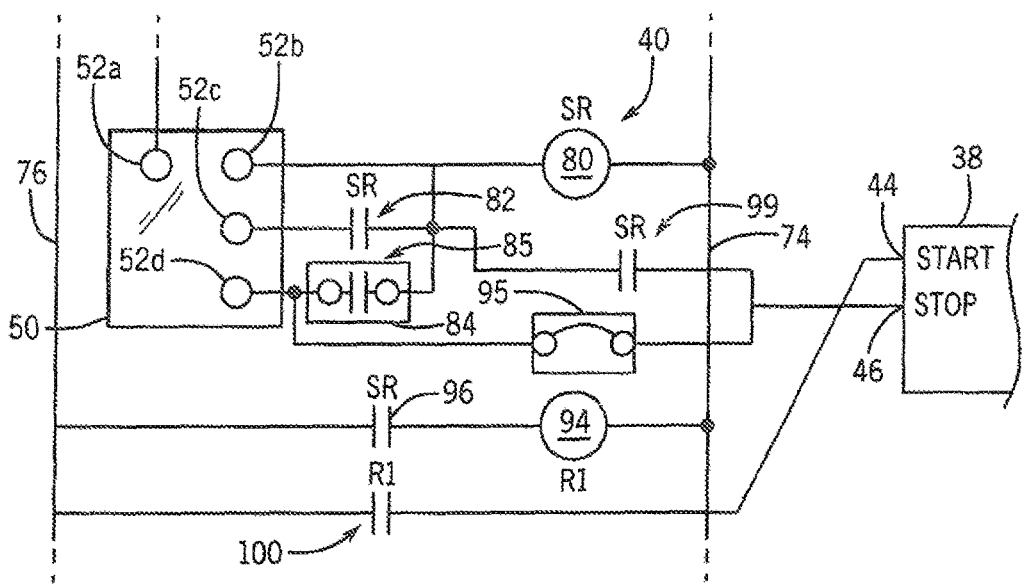
FIG. 5 is a figure similar to that of FIG. 4 showing an alternative configuration for use when the motor power unit is sensitive to timing (race) conditions.

Referring now to FIG. 5, in some cases, motor power unit 38 may be sensitive to race conditions between signals presented at the stop input terminal 46 and start input terminal 44. This sensitivity requires that power must be applied to the stop input terminal 46 before power is applied to the start input terminal 44 in order for the start input to have effect. Near simultaneous application of power to start input terminal 44 and the stop input terminal 46, if the stop input 46 is not clearly asserted first, will cause the start input to be ignored, undesirably leaving the motor in the stop state.

For motor power units 38 sensitive to race conditions, the interface circuit 40 may be modified by the introduction of an additional relay (designated R1) whose coil 94 receives power upon closure of relay contact 96 being a normally-open contact of relay SR. An additional relay contact 99 of relay SR may connect between interconnection points 52b and stop terminal 46. Now when power is applied to relay coil 80 (either latched through interconnection points 52c or unlatched through interconnection points 52b) contact 99 closes providing power to the stop input terminal 46. Relay R1 closes activating coil 94 which then closes relay contact 100 after the normal relay delay of a mechanical relay applying power to the start input terminal 44. Jumper 95 is installed to apply power to the stop input 46 for configurations where the controller 38 receives commands from a communication module via a communication network or human interface module.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context. When elements are indicated to be electrically connected, that connection may be direct or through an intervening conductive element.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

The invention claimed is:

1. A preconfigured motor control power interface circuit for use within a panel system, an interface circuit comprising:
    a motor power unit operative to be selectively controlled in one of a two-wire control and a three-wire control, wherein the two-wire control includes a panel control switch assembly in a first configuration having a multiposition switch operative to generate a start signal in a first position and to generate a stop signal in a second position and wherein the three-wire control includes a panel control switch assembly in a second configuration having a first pushbutton to generate the start signal and a second pushbutton to generate the stop signal;
    a relay having a relay coil controlling first and second normally-open relay contacts, the second normally-open relay contact of the relay providing the start signal to a start input of the motor power unit; and
    a terminal block communicating with the relay and the first normally open relay contact to receive at least one plug wherein the panel control switch assembly is connected to the terminal block by means of a plug attached to the panel control switch assembly to control the motor power unit without alteration of the interface circuit to alternately provide two-wire and three-wire control of the motor power unit according to the configuration of the panel control switch assembly.

2. The interface system of claim 1 further including a prewired panel control switch having a plug, wherein:
    the plug on the prewired panel control switch defines the plug attached to the panel control switch assembly,
    the terminal block includes a first indicia identifying the terminal block, and
    the plug on the prewired panel control switch includes a second indicia matching with the first indicia associated with the terminal block.

3. The interface system of claim 1 wherein:
    the relay is a first relay,
    the relay coil is a first relay coil,
    the interface circuit further comprises a second relay having a second relay coil and the second normally-open relay contact controls the second relay coil having a normally-open relay contact communicating power to the start input of the motor power unit.

4. The interface system of claim 2 wherein the second indicia is a colored sleeve surrounding a harness of wiring attached to the plug on the prewired panel control switch and wherein the first indicia is a corresponding color on the terminal block.

5. An interface system connecting panel controls to a motor power unit operative to be selectively controlled in one of a two-wire control and a three-wire control, wherein the two-wire control includes a panel control switch assembly in a first configuration having a multiposition switch operative to generate a start signal in a first position and to generate a stop signal in a second position and wherein the three-wire control includes a panel control switch assembly in a second configuration having a first pushbutton to generate the start signal and a second pushbutton to generate the stop signal, the interface system comprising:
    a relay having a relay coil controlling first and second normally-open relay contacts; and
    a connector providing a first, second, third, and fourth interconnection point:
        (a) the first interconnection point providing power;
        (b) the second interconnection point connected to the relay coil;
        (c) the third interconnection point communicating with the second interconnection point through the first normally-open relay contact of the relay;
        (d) the fourth interconnection point communicating with the second interconnection point through a two terminal socket adapted to receive a remotely controlled contact;
    wherein the second normally-open relay contact of the relay communicates with a start input of the motor power unit; and
    wherein a first and a second prewired panel control switch for each of the first and second configurations are alternately connected through the connector to the motor power unit without alteration of the interface system to provide two-wire and three-wire control of the motor power unit.

6. The interface system of claim 5 further including a panel control electrical switch prewired to a harness terminating in a first plug and wherein the connector of the interface system is a corresponding second plug adapted to receive a first plug.

7. The interface system of claim 5 wherein:
    the relay is a first relay,
    the relay coil is a first relay coil,
    the interface system further comprises a second relay having a second relay coil and the second normally-open relay contact controls the second relay coil having a normally-open relay contact communicating power to the start input of the motor power unit.

8. The interface system of claim 5 further including a motor power unit selected from the group consisting of a motor drive and a motor controller providing at least one of variable application of electrical power to a motor during starting, stopping or operation start input wherein the start input is only operable if the stop input is not activated.

9. The interface system of claim 6 wherein the panel control electrical switch is prewired to provide two-wire control of the motor power unit.

10. The interface system of claim 6 wherein the panel control electrical switch is prewired to provide three-wire control of the motor power unit.

11. The interface system of claim 7 further including a third normally-open contact of the relay communicating between the second interconnection point and a stop input of the motor power unit.

12. The interface system of claim 8 further including a control cabinet holding the motor power unit, the connector, the relay, and at least one panel control.

13. The interface system of claim 9 wherein the panel control electrical switch provides a three-way switch having a pole connected to the first interconnection point, one throw connected to the second interconnection point, one throw connected to the fourth interconnection point and a remaining throw unconnected.

14. The interface system of claim 10 wherein the panel control electrical switches provide a series connected normally-closed and normally-open pushbutton communicating between the first interconnection point and the second interconnection point with the connection between the pushbuttons communicating with the third interconnection point.

15. The interface system of claim 12 wherein the connector and relay are releasably attached to a DIN rail attached to the control cabinet.

16. The interface system of claim 14 wherein the panel control further provides a three-way switch having a pole and one throw connected in series between the first interconnection point and the series connected normally-closed and normally-open pushbuttons, a second throw connected to the fourth interconnection point, and the third throw unconnected.

* * * * *